Aug. 25, 1970 O. R. RYERSON 3,525,911

SEMICONDUCTOR INTEGRATED CIRCUIT INCLUDING IMPROVED DIODE STRUCTURE

Filed June 6, 1968

WITNESSES:

Bernard R. Giegue

James F. Young

INVENTOR

Olof R. Ryerson

BY

Gordon H. Telfer

ATTORNEY 3,525,911
SEMICONDUCTOR INTEGRATED CIRCUIT INCLUDING IMPROVED DIODE STRUCTURE

Olaf R. Ryerson, Laurel, Md., assignor to Westinghouse Electric Corporation, Pittsburgh, Pa., a corporation of Pennsylvania

Filed June 6, 1968, Ser. No. 735,125
Int. Cl. H01l *19/00*
U.S. Cl. 317—235 8 Claims

ABSTRACT OF THE DISCLOSURE

Minimal chip area without sacrificing performance is achieved by providing all diode elements within a single isolated region with all the input diodes and one of the offset diodes comprising a plurality of "emitters" in a common "base" region and one or more other offset diodes being of the "stoppered" type. The segment of the structure having the input diodes and one offset diode is configured to avoid parasitic transistor action.

BACKGROUND OF THE INVENTION

Field of the invention

This invention relates to semiconductor integrated circuits and particularly to those requiring a plurality of diodes for different functions such as the input diodes and offset diodes of diode-transistor logic integrated circuits.

Description of the prior art

Diode-transistor logic circuits are known and description of their electrical functioning may be found elsewhere. Briefly, they include one or more input diodes and have a characteristic threshold voltage that must be reached by any signal before affecting the circuit. The input diodes are parallel connected to the base of a switching transistor at the output of which a potential appears indicative of the state of the inputs as is well known in NAND-NOR logic circuits. The transistor base is not, however, connected directly to the input diodes. Diodes called offset diodes are connected between the common input diode side and the base. The offset diodes are poled oppositely with respect to the input diodes and provide, by reason of their characteristic forward voltage drop, a relatively fixed potential difference between the transistor base and the input diodes at the common side. The supply voltage, through a suitable resistor, is applied to the common input diode point.

For diode structures in integrated circuits including both diodes and transistors it is known to use regions like, and hence amenable to simultaneous fabrication with, regions of the transistor, meaning that the diode junction has the characteristics of either the emitter-base junction or the base-collector junction of the transistor. Lin Pat. 3,210,620, Oct. 5, 1965, should be referred to for further background.

Improvement in offset diode characteristics can be provided using a "stoppered" diode structure in accordance with the teachings of copending application Ser. No. 579,-418 now U.S. Pat. No. 3,441,815 filed Sept. 14, 1966, by Pollock and Shaunfield and assigned to the assignee of the present invention, which should be referred to for further description of such diodes.

Integrated circuit complexity has reached the point where it is necessary to further minimize the geometry of individual elements so that a greater number of elements can be provided within a single chip. Yet it is necessary that reduction in size be achieved without sacrificing performance.

SUMMARY OF THE INVENTION

Among the objects of this invention are to provide a plurality of diodes, such as for the input and offset diodes of an integrated circuit, in minimum area without sacrificing electrical parameters such as leakage current, breakdown voltage, threshold voltage, or overall circuit speed.

These and other objects and advantages are achieved in a single isolated region of the integrated circuit. As many input diodes as are desired and one of the offset diodes are in a single "base" region with a plurality of "emitter" regions, one for each of the diodes. Parasitic vertical transistor action is avoided by connecting the "base" of the diode structure to the immediately adjacent "collector" region. This connection causes the inverse alpha (amplification) to be zero. This confines the alpha between the plurality of emitters to the lateral component only. The lateral component is minimized by use of conductive material on the "base" region between adjacent "emitter" regions, raising the concentration of impurities in that region, to make the forward gain of the lateral parasitic transistor small. One or more additional offset diodes are provided by using the stoppered diode configuration.

Structures in accordance with this invention are made by the same operations as for the bipolar transistor of the integrated circuit hence the structures are thoroughly compatible with existing technology. Results have shown that reduction of required area for the diodes of upwards of 60% is achieved without any significant sacrifice in performance.

DESCRIPTION OF THE PREFERRED EMBODIMENTS

Figure 1:
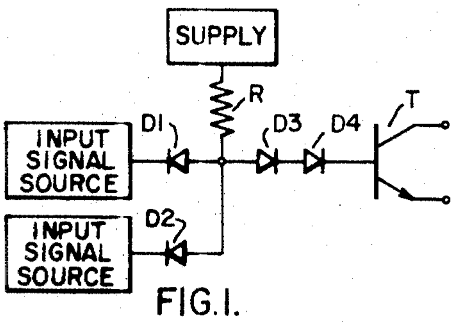
FIG. 1 is a circuit schematic of a diode-transistor logic circuit that may be integrated in accordance with this invention.

FIG. 1 is illustrative of a single DTL gate having two input diodes D1 and D2, although only one or a greater number may be used, and two offset diodes D3 and D4 connected to the base of transistor T. Input signal sources are connected to one side of each of the input diodes and a supply voltage, through a suitable resistor R, is connected to the common point between the input diodes and the offset diodes.

Figure 2:
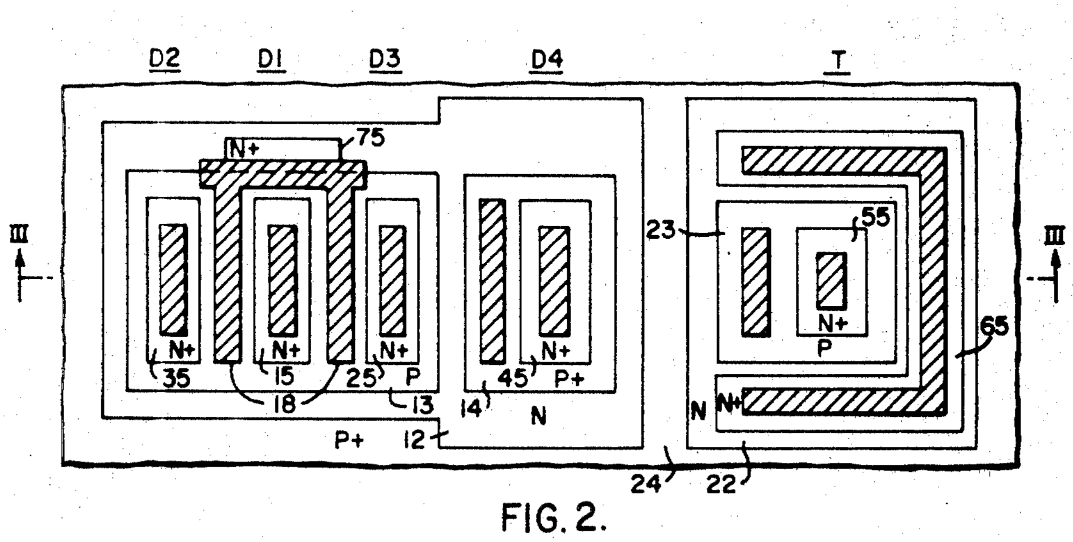
FIGS. 2 and 3 are, respectively, plan and sectional views, the latter being along the line III—III of FIG. 2, of an embodiment of the present invention.
Figure 3:
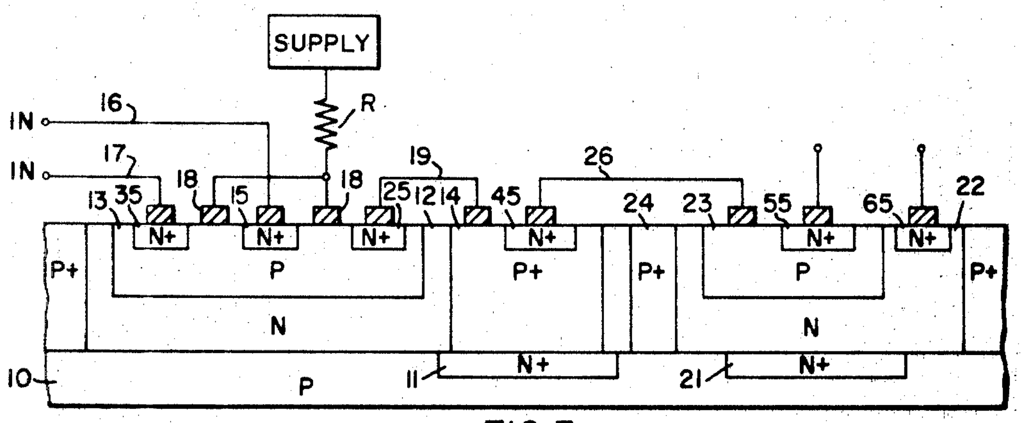

The structure of FIGS. 2 and 3 shows all the diodes and the transistor of FIG. 1 in an embodiment in accordance with this invention. For simplicity of illustration the passivating layer, such as of silicon dioxide with perhaps an additional layer of silicon nitride, has been omitted. The cross hatched elements are conductive material in direct contact with the semiconductor material. FIG. 3 shows conductive interconnections schematically although it will be understood that what is preferred is the common practice of applying conductive layers over the surface of the passivating layer.

The structure includes a substrate 10 of one conductivity type, P type in this example, supporting isolated regions of opposite conductivity type, N type, with diffused isolation walls therebetween. In the diode portion of the structure, specifically for offset diode D4, an N+ first region 11 is provided in a portion of the substrate surface. A second region 12, being one of the isolated regions of N type material, having higher resistivity than the first region, is provided on the substrate surface and over region 11. A P type third region 13 is in a first portion of the second region 12 and terminates within that region, i.e., does not extend through to the substrate 10. A P+ fourth region 14, having lower resistivity than the third region 13, is in a second portion of the second region 12, spaced from the third region 13, and extends through the second region 12 to the first region 11.

Within the P type third region 13 are at least fifth and sixth regions 15 and 25 of N+ type that form a pair of back-to-back PN junction diodes corresponding to one input diode D1 and offset diode D3. By way of further example there has been shown an additional N+ region 35 like the fifth and sixth regions 15 and 25 also in the third region 13 to provide an additional input diode D2.

A seventh region 45 of N+ type material is in the fourth region 14 of the P+ type material forming a PN junction for the additional offset diode D4 of the stoppered type. Conductive coupling between the P+ fourth region 14 and the N+ sixth region 25 provides serial connection between the diode formed by the P type third region 13 and the N+ sixth region 25 and the diode formed by the P+ fourth region 14 and the N+ seventh region 45.

An N type eighth region 22 is provided elsewhere on the substrate 10 separated from the first region by a P+ isolation wall 24. An N+ type ninth region 21 is in the substrate surface under the N type eighth region and provides a "floating collector" region in accordance with the teachings of Murphy Pats. 3,237,062 and 3,321,340. A P type tenth region 23 is in a portion of the eighth region 22 to provide a transistor base. An N+ eleventh region 55 is in the P type tenth region 23 to provide a transistor emitter. An N+ twelfth region 65 is in a portion of the N type eighth region 22 to facilitate making a low resistance ohmic contact. The eighth, ninth and twelfth regions 22, 21, and 65 cooperatively provide the transistor collector region.

In the preferred form of the invention regions in different portions of the structure are of like conductivity type, resistivity and thickness so as to permit simultaneous fabrication by the well known processes employed in integrated circuit production. The N+ type first and ninth regions 11 and 21 are alike and simultaneously diffused. The N type first and eighth regions 12 and 22 are alike in these respects and are portions of the same epitaxially deposited layer. The P+ type fourth region 14 and isolation wall 24 are alike and hence simultaneously diffused. The P type third and tenth regions 13 and 23 are alike and are formed in the same selective diffused operation. The N+ type fifth, sixth, seventh, eleventh and twelfth regions 15, 25, 45, 55 and 65 as well as the additional regions such as 35 of any additional input diodes are alike and simultaneously diffused. Even though the left-hand portion of the structure is not used for transistor action, the similarity between regions sometimes means region 11 is also called a "floating collector" like region 21, region 13 is called a "base" like region 23, and regions 15, 25, 35, and 45 are called "emitters" like region 55. A number of other regions may be simultaneously formed with those described as in present integrated circuit fabrication. For example, in another isolated region like regions 12 and 22 a region like base regions 13 and 23 can be formed for resistor R. Contacts and metallized interconnections may be formed conventionally.

In correspondence to FIG. 1, FIG. 3 shows inputs applied to the N+ fifth and additional regions 15 and 35 of the input diodes D1 and D2 by the conductors 16 and 17. The anodes of the input diodes D1 and D2 as well as the anode of the first offset diode D3 are joined by reason of being a common P type region 13. Additionally, conductive layers 18 between the adjacent ones of the N+ type regions 15, 25 and 35 are provided and connected through a suitable resistor R to a source of supply voltage. The N+ sixth region 25 of diode D3 is connected by a conductor 19 to the P+ fourth region 14 of diode D4. The N+ seventh region 45 of diode D4 is connected by a conductor 26 to the P type base region 23 of the transistor.

In the portion of the structure providing diodes D1, D2 and D3 features are provided to minimize parasitic transistor action such as would occur between adjacent N+ regions and/or from an N+ region through the P type region to the underlying N type region. Such action would adversely affect diode characteristics. The N type second region 12 and the P type third region 13 are connected, such as by an overlapping portion of conductive layer 18, to short the PN junction therebetween and cause the inverse alpha of the three layer structure to be zero. An additional N+ region 75 in the "collector" 12 may be provided for good ohmic contact with conductive layer 18. The "base-collector" short now confines the leakage current path to the lateral parasitic transistor provided by each of adjacent pairs of N+ regions 15, 25 and 35 with the underlying P type third region 13. This parasitic transistor action is made negligible by providing the conductive contact layer 18 between each adjacent pair of emitters to raise the concentration of impurities in that region and cause the gain of the transistor to be very small.

Figure 4:
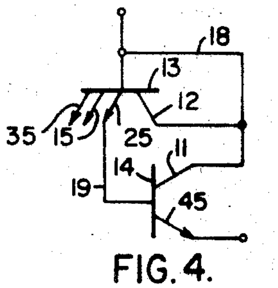
FIG. 4 is a circuit schematic of an approximate equivalent circuit of the diode structure in accordance with this invention.

FIG. 4 shows the approximate equivalent circuit of the diode portion of the structure with reference numerals indicating the regions shown in FIGS. 2 and 3.

Integrated circuits in accordance with this invention may be utilized as have previous DTL circuits but they may now be formed smaller or in higher density on a single chip. Because of the prior practice of utilizing individual input diodes and individual offset diodes a space saving of about 60% is provided even in a circuit employing only one input diode. As additional input diodes are employed the configuration in accordance with this invention provides an even greater margin of space saving.

By way of further example DTL integrated circuits have been made in accordance with this invention starting with a substrate 10 of P type silicon doped to have a resistivity of about 10 ohm cm. to about 40 ohm cm. The selective diffusion of the floating collector regions 11 and 21 was carried out employing arsenic as the impurity and diffusing to a depth of about 6 microns and a sheet resistance of about 20 ohms per square. On a surface of the substrate an epitaxial layer, ultimately providing regions 12 and 22 was grown by thermal decomposition of a silicon compound such as silicon tetrachloride with a donor impurity, phosphorus, included to provide a resistivity of about 0.4 ohm cm. in a layer having a thickness of about 11.0 microns.

Diffusion of the isolation walls 24 and P+ diode region 14 was performed utilizing boron diffused through the entire thickness of the epitaxial layer with the dopant providing sheet resistance of about 5 ohms per square. Diffusion of the P type regions for the anode 13 of the diodes as well as the transistor base 23 was carried out with boron diffused to a depth of about 3.3 microns and a sheet resistance of about 200 ohms per square. Diffusion of the N+ regions 15, 25, 35, 45, 55 and 65 was performed with a phosphorus impurity to a depth of about 2 microns and a sheet resistance of about 2.5 ohms per square.

With such integrated circuits the threshold voltage was found to be about 1.3 volts at 25° C. which is approximately that provided by prior DTL and TTL logic families. Input leakage current of about 1.0 microampere at 25° C. and input breakdown voltage at 25° C. of about 11.0 volts are also consistent with previous performance.

Alternate semiconductor materials, dopants, fabrication techniques, circuit applications as well as other modifications may be used consistent with the teachings of this invention.

I claim:

1. A semiconductor integrated circuit structure comprising: a substrate of a first conductivity type; a first region of a second conductivity type in a portion of a surface of said substrate; a second region of said second conductivity type, having higher resistivity than said first region on said substrate surface; a third region of said first conductivity type in a first portion of said second region and terminating within said second region; a fourth region of said first conductivity type, having lower resistivity than said third region, in a second portion of said second region, spaced from said first portion, and extending through said second region to said first region; at least fifth and sixth regions of said second conductivity type in said third region forming a pair of back to back PN junction diodes; a seventh region of said second conductivity type in said fourth region forming a PN junction diode.

2. The subject matter of claim 1 further comprising: means to connect said fourth and sixth regions providing serial connection between the diode formed by said third and sixth regions and the diode formed by said fourth and seventh regions to permit use of said diodes as offset diodes and the diode formed by said third and fifth regions as an input diode in diode-transistor logic circuits.

3. The subject matter of claim 1 further comprising: at least an eighth region like said second region in conductivity type, resistivity and thickness on said substrate spaced from said second region by an isolation wall like said fourth region in conductivity type, resistivity and thickness; said fifth, sixth and seventh regions having like resistivity and thickness to permit formation of regions having like conductivity type, resistivity and thickness by the same operations.

4. The subject matter of claim 3 further comprising: a ninth region like said first region in conductivity type, resistivity and thickness in said substrate surface under said eighth region; a tenth region like said third region in conductivity type, resistivity and thickness in said eighth region; an eleventh region in said tenth region; a twelfth region in said eighth region, each of said eleventh and twelfth regions being like said fifth, sixth and seventh regions in conductivity type, resistivity and thickness to form a transistor in which said eleventh and tenth regions are, respectively, emitter and base regions and said eighth, ninth and twelfth regions are, collectively, a collector region.

5. The subject matter of claim 1 wherein: a layer of conductive material is disposed on said third region between and spaced from said fifth and sixth regions to minimize gain by transistor action between said fifth, third and sixth regions.

6. The subject matter of claim 5 wherein: at least one additional region like said fifth and sixth regions in conductivity type, resistivity and thickness is in said third region to provide an additional input diode and a layer of conductive material is disposed on said third region between and spaced from each adjacent pair of said fifth, sixth and additional regions.

7. The subject matter of claim 6 wherein: said layers of conductive material between each adjacent pair of regions are mutually connected to a layer of conductive material over and shorting the PN junction between said first and third regions.

8. The subject matter of claim 4 further comprising: an input signal source connected to said fifth region; a resistor connected to said third region; and means to connect said seventh region to said tenth region.

References Cited

UNITED STATES PATENTS

| | | | |
|---|---|---|---|
| 3,333,326 | 8/1967 | Thomas et al. | 317—235 |
| 3,441,815 | 9/1966 | Pollock et al. | 317—235 |

OTHER REFERENCES

Custom Microcircuit Design Handbook, by Fairchild Semiconductor Corp., Mar. 24, 1964; cover sheet, pp. 5–7, and 20–23 relied on.

JERRY D. CRAIG, Primary Examiner

U.S. Cl. X.R.

307—213, 303